US009153988B2

(12) United States Patent
Iwane et al.

(10) Patent No.: US 9,153,988 B2
(45) Date of Patent: Oct. 6, 2015

(54) FULL CHARGE SENSING APPARATUS AND FULL CHARGE SENSING METHOD

(71) Applicants: Furukawa Electric Co., Ltd., Tokyo (JP); Furukawa Automotive Systems Inc., Shiga (JP)

(72) Inventors: Noriyasu Iwane, Tokyo (JP); Taiji Mitsuyama, Tokyo (JP); Shinichi Nomoto, Tokyo (JP); Mamichi Tsuyuki, Tokyo (JP); Etsuzo Sato, Shiga (JP); Tamas Mihalffy, Budapest (HU); Antal Kovats, Budapest (HU)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 394 days.

(21) Appl. No.: 13/769,636

(22) Filed: Feb. 18, 2013

(65) Prior Publication Data

US 2013/0154577 A1 Jun. 20, 2013

Related U.S. Application Data

(63) Continuation of application No. PCT/JP2011/079459, filed on Dec. 20, 2011.

(30) Foreign Application Priority Data

Dec. 20, 2010 (JP) ................................. 2010-283564

(51) Int. Cl.
*H01M 10/44* (2006.01)
*H01M 10/46* (2006.01)
(Continued)

(52) U.S. Cl.
CPC ........... *H02J 7/0052* (2013.01); *G01R 31/3624* (2013.01); *G01R 31/3651* (2013.01);
(Continued)

(58) Field of Classification Search
CPC ...... H02J 7/0021; H02J 7/0026; H02J 7/0047
USPC .......... 320/107, 128, 132, 137, 149, DIG. 19; 324/427, 430; 340/636.1, 636.11; 702/63, 64
See application file for complete search history.

(56) References Cited

U.S. PATENT DOCUMENTS 6,920,404 B2 * 7/2005 Yamanaka ..................... 320/134
7,072,871 B1 * 7/2006 Tinnemeyer .................. 320/132
(Continued)

FOREIGN PATENT DOCUMENTS

CN 1791804 A 6/2006
CN 101275991 A 10/2008
(Continued)

OTHER PUBLICATIONS

Office Action dated Nov. 3, 2014 from corresponding Chinese Patent Application No. 201180057759.8.

*Primary Examiner* — Edward Tso
(74) *Attorney, Agent, or Firm* — Thompson Coburn LLP

(57) ABSTRACT

A full charge sensing apparatus for sensing a fully charged state of a secondary battery based on an equivalent circuit model of the secondary battery includes a measuring unit that measures a voltage and a current during charging of the secondary battery, a learning unit that performs a learning process on a plurality of parameters in the equivalent circuit model using a result of measurement of the measuring unit, and a determining unit that determines that the secondary battery is in a fully charged state in a case where, among the parameters on which the learning process has been performed by the learning unit, a parameter corresponding to a reaction resistance of the secondary battery is greater than a predetermined threshold.

13 Claims, 7 Drawing Sheets

(51) Int. Cl.
*H02J 7/00* (2006.01)
*G01R 31/36* (2006.01)
*H02J 7/04* (2006.01)
*H01M 10/48* (2006.01)
*H01M 10/42* (2006.01)

(52) U.S. Cl.
CPC ........... *H01M10/425* (2013.01); *H02J 7/0077* (2013.01); *H02J 7/045* (2013.01); *H01M 10/48* (2013.01); *H01M 2010/4271* (2013.01); *H02J 2007/0049* (2013.01)

(56) References Cited

U.S. PATENT DOCUMENTS

| | | | |
|---|---|---|---|
| 8,344,685 B2 * | 1/2013 | Bertness et al. | 320/104 |
| 8,719,195 B2 * | 5/2014 | Frisch et al. | 320/137 |
| 2005/0017686 A1 * | 1/2005 | Sakakibara et al. | 320/132 |
| 2006/0186890 A1 | 8/2006 | Iwane et al. | |
| 2007/0013344 A1 * | 1/2007 | Aradachi et al. | 320/132 |
| 2008/0243405 A1 | 10/2008 | Iwane | |
| 2009/0027056 A1 * | 1/2009 | Huang et al. | 320/132 |
| 2012/0038312 A1 * | 2/2012 | Abe et al. | 320/101 |
| 2013/0069658 A1 * | 3/2013 | Rich et al. | 324/426 |

FOREIGN PATENT DOCUMENTS

| | | |
|---|---|---|
| JP | 2005-091217 A | 4/2005 |
| JP | 2005-269760 A | 9/2005 |
| JP | 2008-107168 A | 5/2008 |
| JP | 2008-145349 A | 6/2008 |
| JP | 2010-500539 A | 1/2010 |

* cited by examiner

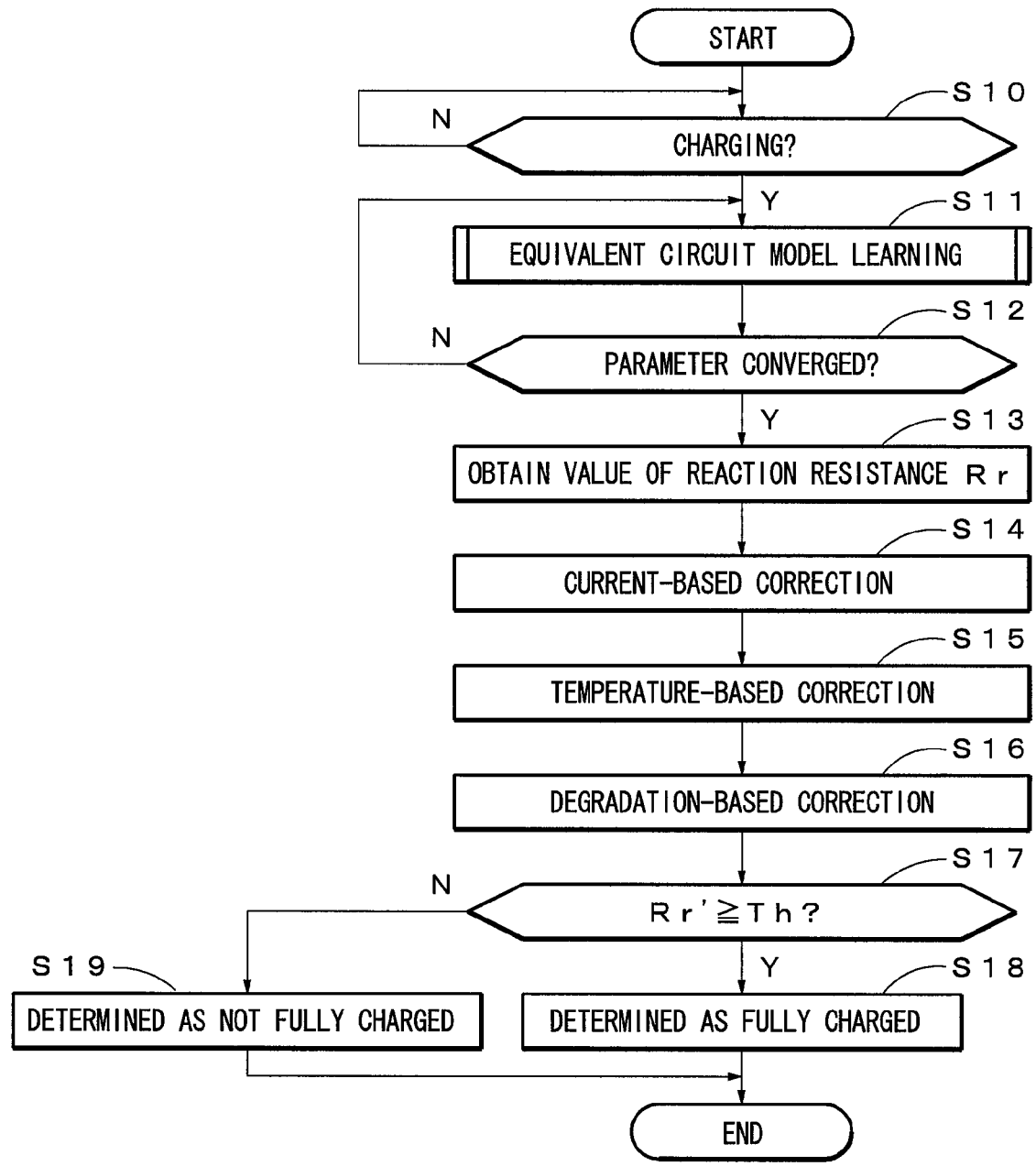
F I G. 5

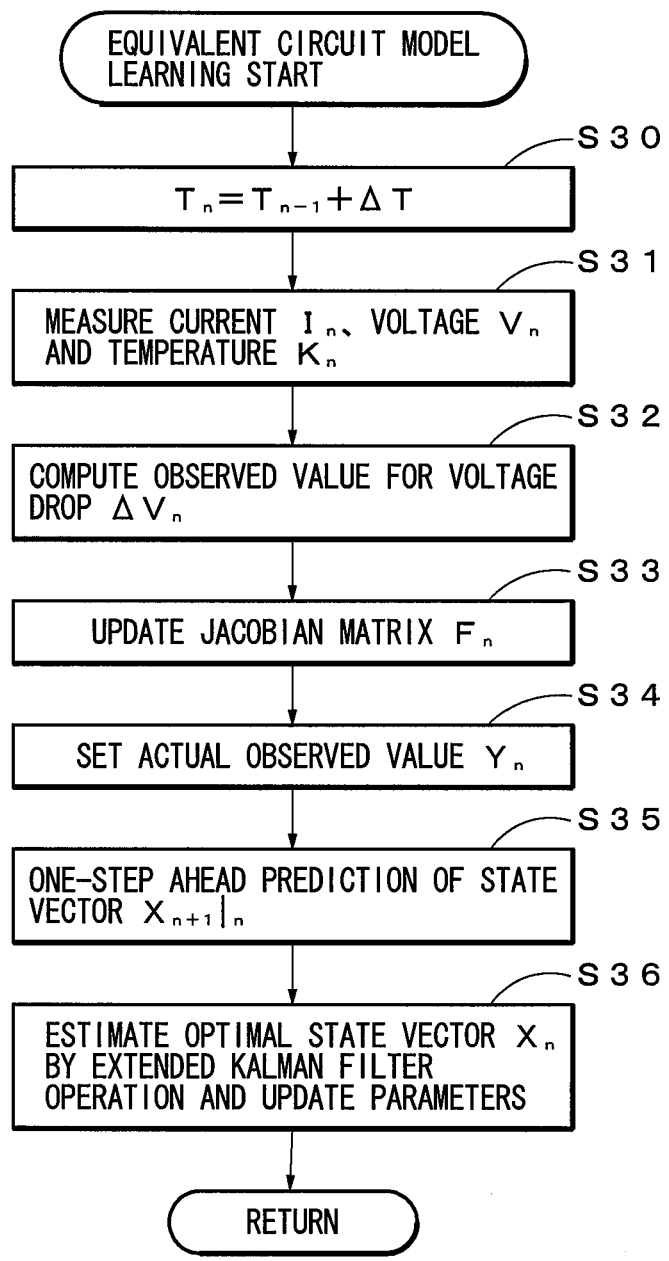
F I G. 6

FIG. 7A

| Rr (mΩ) | Imes (A) | R'r (mΩ) |
|---|---|---|
| 2.5 | 5 | 2.6 |
| 2.5 | 10 | 2.7 |
| 2.5 | 15 | 2.8 |
| ⋮ | ⋮ | ⋮ |

FIG. 7B

| Rr (mΩ) | K (°C) | R'r (mΩ) |
|---|---|---|
| 2.5 | 30 | 2.6 |
| 2.5 | 25 | 2.5 |
| 2.5 | 20 | 2.4 |
| ⋮ | ⋮ | ⋮ |

FIG. 7C

| Rr (mΩ) | Rs (mΩ) | R'r (mΩ) |
|---|---|---|
| 2.5 | 0.5 | 2.5 |
| 2.6 | 0.6 | 2.5 |
| 2.7 | 0.7 | 2.5 |
| ⋮ | ⋮ | ⋮ |

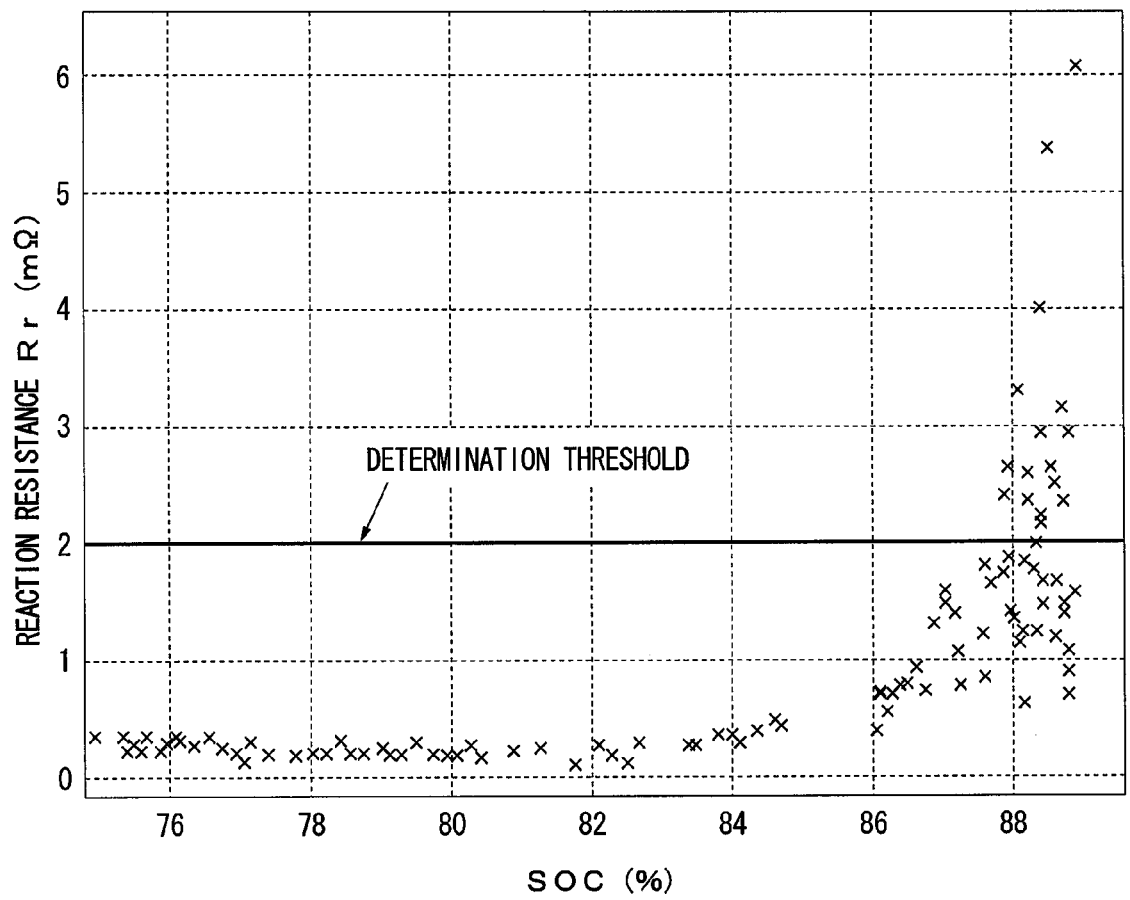
F I G. 8

FIG. 9A

| Th | Imes (A) | Th' |
|---|---|---|
| 2.0 | 5 | 2.3 |
| 2.0 | 10 | 2.2 |
| 2.0 | 15 | 2.1 |
| ⋮ | ⋮ | ⋮ |

FIG. 9B

| Th | K (°C) | Th' |
|---|---|---|
| 2.0 | 30 | 1.9 |
| 2.0 | 25 | 2.0 |
| 2.0 | 20 | 2.1 |
| ⋮ | ⋮ | ⋮ |

FIG. 9C

| Th | Rs (mΩ) | Th' |
|---|---|---|
| 2.0 | 0.5 | 2.0 |
| 2.0 | 0.6 | 2.1 |
| 2.0 | 0.7 | 2.2 |
| ⋮ | ⋮ | ⋮ |

FULL CHARGE SENSING APPARATUS AND FULL CHARGE SENSING METHOD

CROSS REFERENCE TO RELATED APPLICATIONS

This is a continuation application of International Patent Application No. PCT/JP2011/079459, filed Dec. 20, 2011, which claims the benefit of Japanese Patent Application No. 2010-283564, filed Dec. 20, 2010, the full contents of both of which are hereby incorporated by reference herein in their entirety.

BACKGROUND OF INVENTION

1. Field of the Invention

The present invention relates to a full charge sensing apparatus and a full charge sensing method.

2. Background of the Invention

In the related art, determination of whether a secondary battery has reached a fully charged state is carried out by determining whether or not an SOC (State of Charge), which is a charging rate, has reached 100%. Such an SOC-sensing method may be, for example, a method as disclosed in Japanese Laid-Open Patent Application No. 2005-091217 in which a stable voltage OCV (Open Circuit Voltage) of the secondary battery is measured and an SOC is predicted from this OCV.

Japanese Laid-Open Patent Application No. 2008-145349 discloses a technique in which, since SOV=100% does not always hold at the time the OCV is measured, in order to deal with such a case, a change in SOC after the measurement of OCV is computed by hour integration based on a continuous observation of an electric current.

With the technique disclosed in Japanese Laid-Open Patent Application No. 2005-091217, a fully charged state is determined based on a correlation between OCV and SOC, and the correlation between OCV and SOC varies depending on a type of the secondary battery. Therefore, for example, as in the case of a lead-acid battery of automobiles where a product arbitrarily selected from a group of products supplied from various manufactures by a user is used, there may be a case in which the fully charged state cannot be determined accurately.

With the technique disclosed in Japanese Laid-Open Patent Application No. 2008-145349, in order to compute a change in SOC caused by the entering/exiting of the electric current into/out of the secondary battery, it is necessary to compute a ratio of an amount of entry/exit against a capacity of the secondary battery. However, there may be a case where the fully charged state cannot be determined accurately, since an individual difference and a sensing error exist for this capacity.

Therefore, an object of the present invention is to provide a full charge sensing apparatus and a full charge sensing method capable of accurately determining the fully charged state regardless of the type of secondary battery.

SUMMARY OF INVENTION

In order to solve the aforementioned problem, a full charge sensing apparatus of an aspect of the invention is a full charge sensing apparatus for sensing a fully charged state of a secondary battery based on an equivalent circuit model of the secondary battery, the apparatus including a measuring unit that measures a voltage and a current during charging of the secondary battery, a learning unit that performs a learning process on a plurality of parameters in the equivalent circuit model using a result of measurement of the measuring unit, and a determining unit that determines that the secondary battery is in a fully charged state in a case where, among the parameters on which the learning process has been performed by the learning unit, a parameter corresponding to a reaction resistance of the secondary battery is greater than a predetermined threshold.

With such a configuration, a full charge sensing apparatus can be provided that is capable of accurately determining a fully charged state regardless of the type of the secondary battery.

According to another aspect, in addition to the above aspect, one of the learning unit and the detecting unit corrects one of a value of the reaction resistance and the threshold based on a value of the current.

With such a configuration, the fully charged state can be accurately sensed regardless of a magnitude of the electric current.

According to yet another aspect, in addition to the above aspect, one of the learning unit and the detecting unit corrects one of a value of the reaction resistance and the threshold based on a temperature of the secondary battery.

With such a configuration, the fully charged state can be accurately sensed regardless of whether the temperature is high or low.

According to still another aspect, one of the learning unit and the detecting unit corrects one of a value of the reaction resistance and the threshold based on a state of degradation of the secondary battery.

With such a configuration, the fully charged state can be accurately detected regardless of the state of degradation of the battery.

According to still another aspect, in addition to the above aspect, the learning unit optimizes the plurality of parameters by a Kalman filter operation in such a manner that errors between values of the voltage and the current measured by the measuring unit and a response of the equivalent circuit model are minimized.

With such a configuration, the fully charged state can be accurately detected even in an environment under presence of a noise.

According to still another aspect, in addition to the above aspect, the learning unit optimizes the plurality of parameters by a least square operation in such a manner that errors between values of the voltage and the current measured by the measuring unit and a response of the equivalent circuit model are minimized.

With such a configuration, a robust sensing apparatus can be provided.

According to still another aspect, in addition to the above aspect, the learning unit optimizes the plurality of parameters by a neural network in such a manner that errors between values of the voltage and the current measured by the measuring unit and a response of the equivalent circuit model are minimized.

With such a configuration, a good sensing result can be obtained by a comparatively small computation amount.

According to another aspect, in addition to the above aspect, the learning unit optimizes the plurality of parameters by a support vector machine in such a manner that errors between values of the voltage and the current measured by the measuring unit and a response of the equivalent circuit model are minimized.

With such a configuration, an appropriate parameter is derived without the learning being halted at a local optimum solution and thus the fully charged state can be accurately detected based on the parameter.

According to yet another aspect, a secondary battery power source system has the aforementioned full charge sensing system.

With such a configuration, a secondary battery power source system can be provided that is capable of accurately determining the fully charged state regardless of the type of the secondary battery.

According to a full charge sensing method of an aspect of the invention, in a full charge sensing method of sensing a fully charged state of a secondary battery based on an equivalent circuit model of the secondary battery, the method includes measuring a voltage and a current during charging of the secondary battery, performing a learning process on a plurality of parameters in the equivalent circuit model using a result of said measuring of a voltage and a current during charging of the secondary battery, and performing a determination in which the secondary battery is determined to be in a fully charged state in a case where a parameter corresponding to a reaction resistance of the secondary battery is greater than a predetermined threshold, the parameter corresponding to the reaction resistance of the secondary battery being one of the parameters on which the learning process has been performed.

With such a method, a full charge sensing method can be provided that can accurately determine the fully charged state regardless of the type of secondary battery.

According to an aspect of the invention, a full charge sensing apparatus and a full charge sensing method can be provided that can accurately determine the fully charged state regardless of the type of secondary battery.

BRIEF DESCRIPTION OF DRAWINGS

FIG. 5 is a flowchart for explaining a flow of a process executed according to the embodiment shown in FIG. 1.

FIG. 6 is a flowchart for explaining details of the process of step S11 in FIG. 5.

FIGS. 7A to 7C are exemplary tables for correction of a reaction resistance.

FIG. 8 is a plot illustrating a relationship between the reaction resistance and SOC.

FIGS. 9A to 9C are exemplary tables for correction of a threshold.

DETAILED DESCRIPTION

Hereinafter, embodiments of the present invention will be described.

(A) Configuration of an Embodiment

Figure 1:
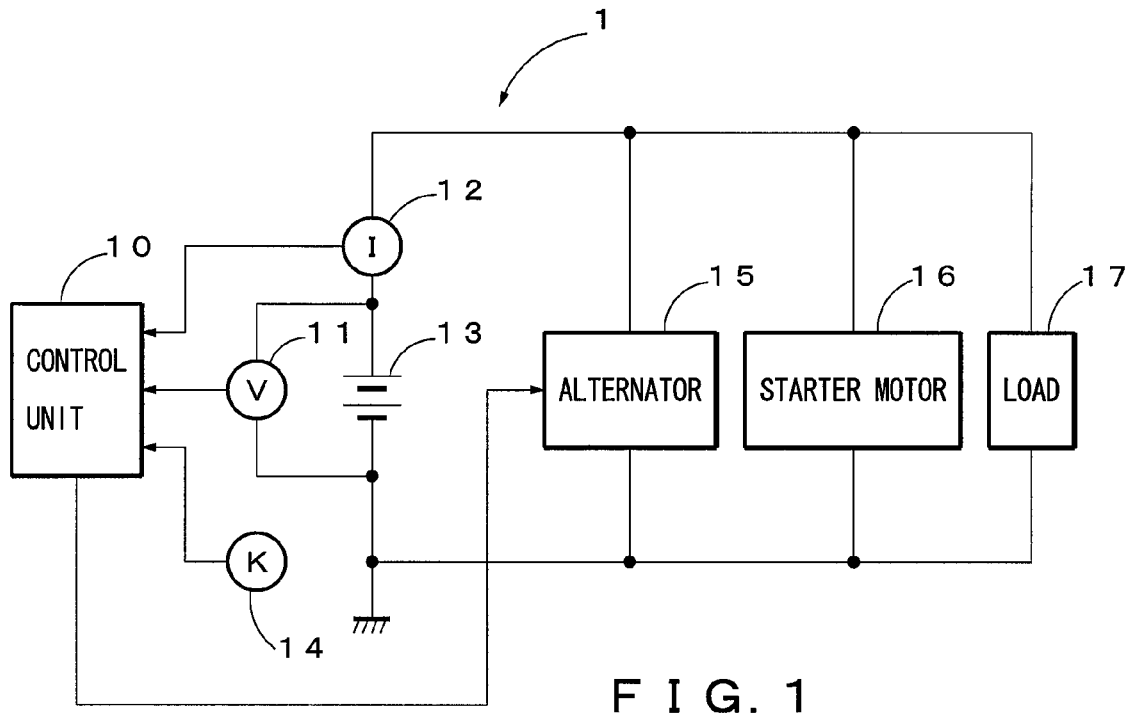
FIG. 1 is a diagram illustrating an exemplary configuration of a full charge sensing apparatus of an embodiment of the present invention.

FIG. 1 is a diagram illustrating an exemplary configuration of a secondary battery power source system having a full charge sensing apparatus according to an embodiment of the present invention. As shown in FIG. 1, a full charge sensing apparatus 1 of the present embodiment includes, as its main constituent elements, a control unit 10 (corresponds to a "learning unit" and a "determining unit" in the claims), a voltage detecting unit 11 (corresponds to a "measuring unit" in the claims), a current detecting unit 12 (corresponds to a "measuring unit" in the claims) and a temperature detecting unit 14, and senses a fully charged state of a lead-acid battery 13 (corresponds to a "secondary battery" in the claims). In this example, an alternator 15, a starter motor 16 and a load 17 are connected to the lead-acid battery 13 via the current detecting unit 12. In the present embodiment, the full charge sensing apparatus 1 will be described for a case where it is, for example, installed in a vehicle such as an automobile. However, it may also be used for other applications.

Figure 2:
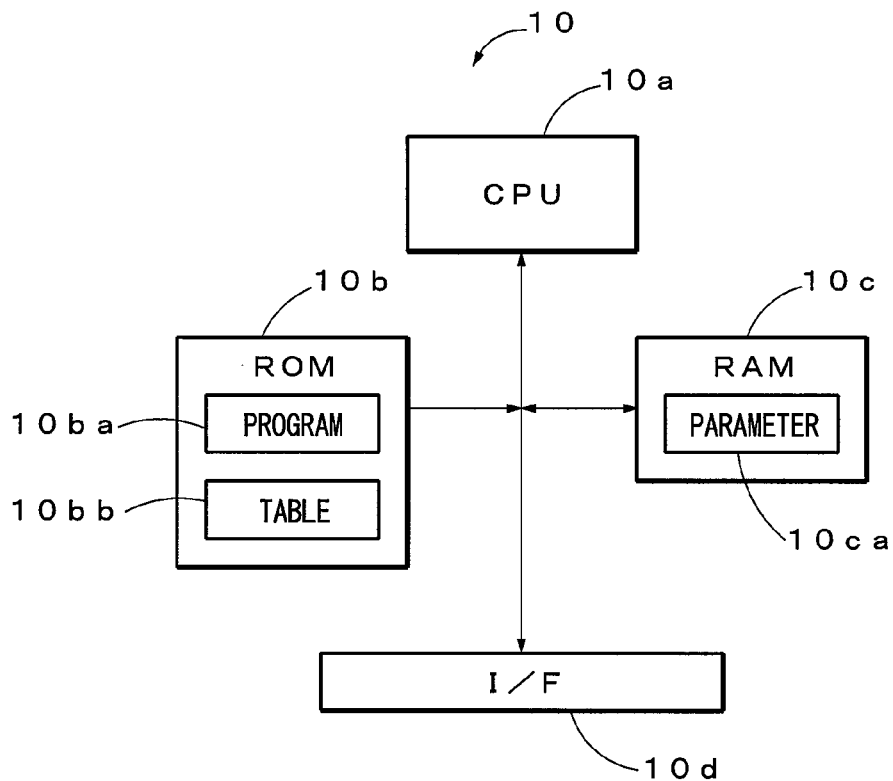
FIG. 2 is a diagram illustrating an exemplary configuration of a control unit of FIG. 1.

As shown in FIG. 2, the control unit 10 includes, as its main constituent elements, a CPU (Central Processing Unit) 10a, a ROM (Read Only Memory) 10b, a RAM (Random Access Memory) 10c and an I/F (Interface) 10d. The CPU 10a controls each constituent element of the apparatus in accordance with a program 10ba stored in the ROM 10b. The ROM 10b may be a semiconductor memory and stores a program 10ba, a table 10bb and other information. The RAM 10c may be a semiconductor memory and stores a parameter 10ca and other information in a rewritable manner. The I/F 10d converts detection signals from the voltage detecting unit 11, the current detecting unit 12 and the temperature detecting unit 14 into digital signals and inputs them, and, when the lead-acid battery 13 has come to a fully charged state, reduces a load on an engine such as a reciprocating engine (not shown) by cutting off an electromagnetic clutch (not shown) of the alternator 15.

The voltage detecting unit 11 detects a terminal voltage of the lead-acid battery 13 and notifies the control unit 10 of the terminal voltage. The current detecting unit 12 detects an electric current flowing through the lead-acid battery 13 and notifies the control unit 10 of the electric current. The temperature detecting unit 14, which may be, for example, a thermistor, detects the temperature of the lead-acid battery 13 or an ambient temperature of the lead-acid battery 13 and notifies the control unit 10 of the temperature. The alternator 15 may be, for example, driven by an engine such as a reciprocating engine and charge the lead-acid battery 13 by generating a direct current power. The starter motor 16 may, for example, include a direct current motor, rotate by a direct current supplied from the lead-acid battery 13 and start up the engine. The load 17 may, for example, include devices such as a steering motor, defogger, head lamp, a windshield wiper, a direction indicator lamp, and a navigating device.

Figure 3:
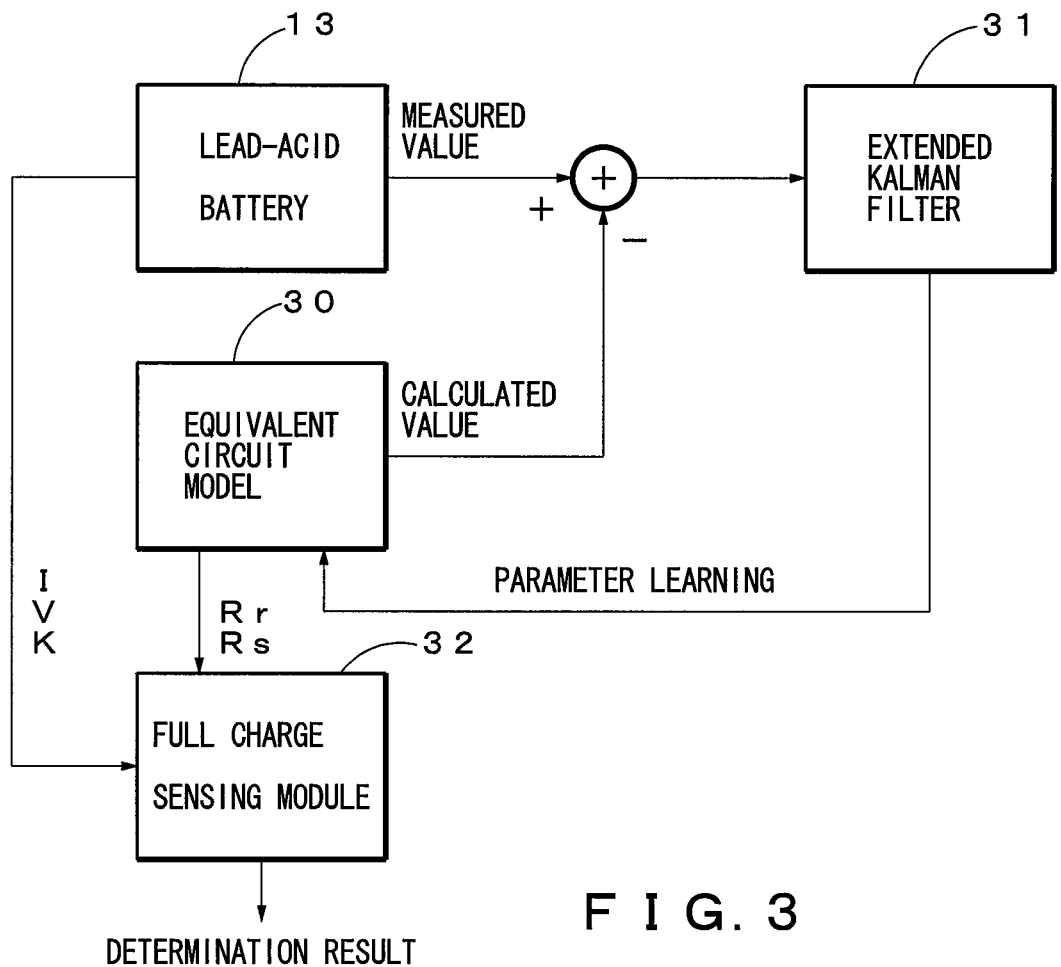
FIG. 3 is a diagram for explaining a process algorithm executed in the present embodiment.

FIG. 3 is a diagram for explaining an outline of a process algorithm which is realized by executing a program 10ba. As shown in FIG. 3, in the present embodiment, an equivalent circuit model 30 for the lead-acid battery 13 is built which has a plurality of parameters. Then, a measured value is obtained by measuring the target lead-acid battery 13 and a calculated value corresponding to the measured value is obtained in accordance with the equivalent circuit model 30. By computing a deviation between these measured value and the calculated value, optimal parameters are estimated by adaptive learning based on an extended Kalman filter 31. Then, by updating the equivalent circuit model 30 with the estimated parameters, the equivalent circuit model 30 can be optimized. A full charge sensing module 32 senses a fully charged state based on the optimally learned parameter Rr.

In this specification, "adaptive learning" is a method in which a flexible and general model having parameters is prepared and the parameters are statistically and adaptively optimized by learning. In each of the embodiments described below, an extended Kalman filter is used as an example of adaptive learning. However, the present invention is not limited thereto, and, for example, a least square method-based adaptive learning, a neural network model-based adaptive learning, a support vector machine-based adaptive learning or a genetic algorithm-based adaptive learning may also be employed. In other words, any method can be employed as long as it is a method in which a model of a target to be learnt is built and parameters constituting the model are optimized with a result obtained by observation.

Figure 4:
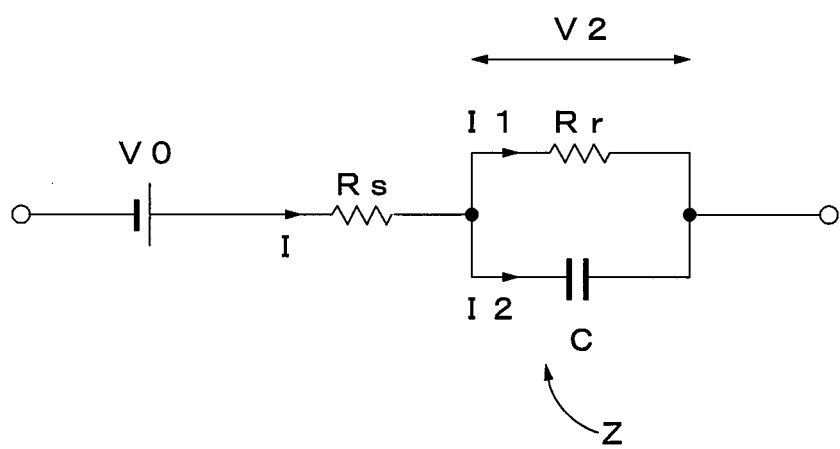
FIG. 4 is a diagram illustrating an exemplary equivalent circuit model of a lead-acid battery.

FIG. 4 is an exemplary diagram illustrating an equivalent circuit model 30 (in this example, an electric equivalent circuit) of the lead-acid battery 13. In this example, the equivalent circuit model 30 includes, as its main constituent elements, a voltage source V0, a solution resistance Rs, a reaction resistance Rr, and a capacitor C.

Here, the solution resistance Rs is an internal resistance including, as its main elements, a solution resistance of an electrolyte and a conductive resistance of an electrode of the lead-acid battery 13. An impedance Z is an equivalent circuit corresponding to a positive electrode of the lead-acid battery 13 and the electrolyte in contact with the positive electrode. The impedance basically has a characteristic in accordance with Butler-Volmer's equation and can be expressed as a parallel-connected circuit of the reaction resistance Rr and the capacitor C. The voltage source V0 is an ideal voltage source having an internal impedance of 0.

(B) Principle of Operation of the Embodiment

Hereinafter, an operation of the present embodiment will be described. Hereinafter, first, the principle of operation of the present embodiment will be explained and then a detailed operation will be described with reference to FIGS. 5 and 6.

In the present embodiment, using the equivalent circuit model of the lead-acid battery 13 shown in FIG. 4, a state vector is defined which includes at least the reaction resistance Rr of this equivalent circuit model as the parameters. In a case where the lead-acid battery 13 is in a charged state, a current value and a voltage value are obtained as the measured values, and the parameters are optimized statistically and adaptively by a learning process. Then, the reaction resistance Rr is obtained from the optimized parameters, and in a case where the reaction resistance Rr is greater than a predetermined threshold Th, the lead-acid battery 13 is determined to be in a fully charged state. FIG. 8 is a plot illustrating an exemplary relationship between the reaction resistance Rr and an SOC. In this example, the value of the reaction resistance Rr increases from around a point where the SOC exceeds 84%, and sharply increases from a point exceeding 88%. In other words, since the reaction resistance Rr during charge rapidly increases as the SOC reaches near 90%, the fully charged state can be detected by detecting that the reaction resistance Rr has become greater than the predetermined threshold Th.

In this manner, in the present embodiment, the equivalent circuit model including the reaction resistance Rr is created and the parameters constituting the equivalent circuit model are optimized by adaptive learning. Then, the reaction resistance Rr is obtained from the optimized parameters, and, in a case where the reaction resistance Rr is greater than the predetermined threshold Th, it is determined to be in a fully charged state. Here, regarding the behavior of the reaction resistance Rr during the charging, since there is not much difference due to the type or individual difference of the lead-acid battery 13, erroneous detection due to a difference in the type of lead-acid battery 13 (e.g., the difference in the manufacturer and the difference in the production lot) or a difference due to individual difference can be prevented.

(C) Detailed Operation of the Embodiment

FIG. 5 is a flowchart for explaining a flow of a process executed according to the aspect of the invention shown in FIG. 1. When the process of this flowchart is initiated, the following steps are performed.

In step S10, the CPU 10a determines whether or not it is during charging of the lead-acid battery 13, based on a current value supplied from the current detecting unit 12 and a voltage value supplied from the voltage detecting unit 11. If it is during charging (step S10: Yes), the process proceeds to step S11. Otherwise (step S10: No), a similar process is repeated. For example, in a case where the voltage detected by the voltage detecting unit 11 is greater than or equal to the predetermined value and the current detecting unit 12 has detected that the current having a value greater than or equal to a predetermined value is flowing in a direction into the lead-acid battery 13, it is determined to be during charging and the process proceeds to step S11.

In step S11, the CPU 10a carries out a learning process on the equivalent circuit model 30 shown in FIG. 3. Details of this learning process will be described later with reference to FIG. 6.

In step S12, the CPU 10a determines whether a value of the parameter to be learned in step S11 has converged. If it is determined to have converged (step S12:Yes), the process proceeds to step S13. Otherwise (step S12:No), the process returns to step S11 and a similar process is repeated. For example, a standard deviation of a residual of the reaction resistance Rr to be determined in step S17 may be derived, and it can be determined to have converged if the standard deviation becomes less than or equal to the predetermined threshold. In order to avoid false determination, time may be included in the elements to be determined. Specifically, it can be determined to have converged in a case where the standard deviation has come to a value less than or equal to the predetermined threshold after a predetermined time elapsed. Alternatively, it can be determined to have converged in a case where a predetermined time has elapsed after the standard deviation has come to a value less than or equal to the predetermined threshold.

In step S13, the CPU 10a obtains a value of the reaction resistance Rr from the parameters obtained by the learning process of step S11.

In step S14, the CPU 10a performs a current-based correction on the reaction resistance Rr obtained in step S13. In other words, since the reaction resistance Rr has characteristics that rapidly decrease as the current increases from 0, and converges to a predetermined value as the voltage value becomes large to some extent, a correction is performed such that the reaction resistance Rr becomes constant regardless of the value of the current. As a method of correction, for example, a table shown in FIG. 7A in which the value of the reaction resistance Rr, the value of current Imes and the corrected reaction resistance R'r are associated is, for example, stored in the ROM 10b as a table 10bb, and correction can be performed based on this table. In the example of FIG. 7A, a reference case is determined to be a case where the current is 0, and the reaction resistance Rr for a case where the current is not 0 is corrected to the reference case of 0. For example, when the reaction resistance Rr is 2.5 mΩ, it is corrected to 2.6 mΩ for a case where the current Imes is 5 A, 2.7 mΩ for a case where the current Imes is 10 A, and 2.8 mΩ for a case where the current Imes is 15 A. An average current during the measurement can be used as the current value Imes. It is to be noted that, in order to deal with a case where there is a large variation in the current value, the process of step S14 may be performed, for example, between steps S11 and S12.

In step S15, the CPU 10a performs a temperature-based correction on the reaction resistance Rr corrected in step S14. In other words, since the reaction resistance Rr has characteristics that decreases as the temperature increases, correction is performed in such a manner that the reaction resistance Rr becomes constant regardless of the temperature. As a method of correction, for example, in a case where the corrected reaction resistance after the correction in the step S14 is set as Rr again, a table as shown in FIG. 7B indicating an association between the value of the reaction resistance Rr, the temperature K and the corrected reaction resistance R'r is, for example, stored in the ROM 10b as a table 10bb, and correction can be performed based on this table. It is to be noted that in the example of FIG. 7B, a case where the temperature is 25° C. is taken as a reference and the reaction resistance Rr for a case where the temperature is not 25° C. is corrected to the reference case of 25° C. For example, in a case where the reaction resistance Rr is 2.5 mΩ, it is corrected to 2.6 mΩ for a case of 30° C., it remains unchanged at 2.5 mΩ for a case of 25° C., and it is corrected to 2.4 mΩ for a case of 20° C. Similarly to the process of step S14, the process of step S15 can be inserted between steps S11 and S12. However, since variation in the temperature is not as large as that of the current, a load on the process can be reduced by performing the correction collectively after completion of the learning process.

In step S16, the CPU 10a performs correction based on the degradation of the lead-acid battery 13 on the reaction resistance Rr corrected in step S15. In other words, since the reaction resistance Rr has characteristics that increases as the degradation of the lead-acid battery 13 progresses, correction is performed in such a manner that the reaction resistance Rr becomes constant regardless of the progress of the degradation. As a method of correction, for example, in a case where the corrected reaction resistance Rr corrected in step S15 is set as Rr again, a table shown in FIG. 7C indicating an association between the value of the reaction resistance Rr, the solution resistance Rs correlated with the progression of degradation and the corrected reaction resistance R'r is, for example, stored in the ROM 10b as a table 10bb, and correction can be performed based on this table. It is to be noted that in the example of FIG. 7C, a new product condition (in this example, a state of Rs=0.5 mΩ) is taken as a reference and the reaction resistance Rr for a case where the degradation has progressed and Rs≠0.5 mΩ is corrected to the reference case of Rs=0.5 mΩ. For example, in a case where the reaction resistance Rr is 2.5 mΩ, correction is not performed when the solution resistance Rs=0.5 mΩ, and it is corrected to 2.5 mΩ for a case where the reaction resistance Rr is 2.6 mΩ and when Rs=0.6 mΩ, and it is corrected to 2.5 mΩ for a case where the reaction resistance Rr is 2.7 mΩ and when Rs=0.7 mΩ. Similarly to the process of step S14, the process of step S16 can be inserted between steps S11 and S12. However, since the variation in the gradation is not as large as that of the current, a load of the process can be reduced by performing the correction collectively after the completion of the learning process.

In step S17, the CPU 10a compares Rr' obtained by the corrections in steps S14-S16 with the threshold value Th. In a case where Rr'≥Th is satisfied (step S17:Yes), the process proceeds to step S18. Otherwise (step S17:No), the process proceeds to step S19. FIG. 8 is a plot illustrating a relationship between the reaction resistance Rr and the SOC. In this plot, the "x" indicates each measurement point. In this example, the value of the reaction resistance Rr increases from around a point where SOC exceeds 84%, and rapidly increases after having exceeded 88%. Accordingly, for example, 2 mΩ can be selected as the threshold Th. In such a case, in a case where Rr'≥2 mΩ is satisfied, the process proceeds to step S17.

In step S18, the CPU 10a determines that the lead-acid battery 13 is in a fully charged state. For example, by controlling a regulator (not shown) installed in the alternator 15 and decreasing a power generation voltage of the alternator 15, reduces the load of the reciprocating engine and improves fuel efficiency.

In step S19, the CPU 10a determines that the lead-acid battery 13 is not in a fully charged state. For example, by controlling a regulator (not shown) installed in the alternator 15 and increasing a power generation voltage of the alternator 15, performs charging of the lead-acid battery 13 by the alternator 15.

Next, referring to FIG. 6, the details of the process in step S11 in FIG. 5 will be described. When the process of FIG. 6 is initiated, the following steps are carried out.

In step S30, the CPU 10a substitutes a value obtained by adding the previous value $T_{n-1}$ and $\Delta T$ into a variable indicating time $T_n$. It is to be noted that, for example, $\Delta T$ may be several msec to several hundreds of msec.

In step S31, the CPU 10a measures the current $I_n$, the voltage $V_n$ and the temperature K based on the detection signals from the current detecting unit 12, the voltage detecting unit 11 and the temperature detecting unit 14.

In step S32, the CPU 10a applies the following Equation 1 to the voltage $V_n$ measured in step S31, and computes a voltage drop $\Delta V_n$.

[Equation 1]

$$\Delta V_n = V_n - OCV \quad (1)$$

Here, OCV stands for a stable open circuit voltage and represents an open circuit voltage at an electrochemical equilibrium state. The stable open circuit voltage need not be in a completely electrochemical equilibrium state, and may include a state near equilibrium. As a method of deriving the OCV, for example, the OCV may be a terminal voltage of the lead-acid battery 13 measured immediately before the start up of the lead-acid battery 13 or a stable open circuit voltage of the lead-acid battery 13 estimated from a charge-discharge state of the lead-acid battery 13.

In step S32, the CPU 10a updates a Jacobian matrix $F_n$ in accordance with the following Equation 2 using an n-th observed value and a previous state vector estimation value.

[Equation 2]

$$F_n = \mathrm{diag}(1 - \Delta T/Rr_n \cdot C_n, 1, 1, 1, 1) \quad (2)$$

In the equation, diag( ) represents a diagonal matrix.

In step S34, as represented by the following Equation 3, the CPU 10a takes $\Delta V_n$ obtained by the calculation in step S32 as an actual observed value $Y_n$ of the extended Kalman filter.

[Equation 3]

$$Y_n = \Delta V_n \quad (3)$$

In step S35, the CPU 10a derives a one-step ahead state vector $X_{n+1}|_n$ using the following Equation 4:

[Equation 4]

$$X_{n+1}|_n = F_n \cdot X_n + U_n \quad (4)$$

Here, $X_n$ and $U_n$ are expressed by the following Equations 5 and 6. In the equations, T denotes a transposed matrix.

[Equation 5]

$$X_n^T = (\Delta V2, Rs, Rr, C, V0) \quad (5)$$

[Equation 6]

$$U_n^T = (\Delta t \cdot I_n/C, 0, 0, 0, 0) \quad (6)$$

Further, by defining $H_n^T$ as expressed in the following Equation 7, an observation equation and a predicted observed value $Y_{n+1}|_n$ can be determined as expressed in Equation 8.

[Equation 7]

$$H_n^T = (1, I_n, 0, 0, 0, 0) \quad (7)$$

[Equation 8]

$$Y_n = H_n^T \cdot X_n \quad (8)$$

In step S36, based on a one-step ahead predicted value of the state vector $X_{n+1}|_n$, an actual observed value $Y_{n+1}$ and a predicted observed value $Y_{n+1}|_n$, the CPU 10a sequentially estimates an optimal state vector $X_n$ using an extended Kalman filter operation by Kalman gain calculation and filtering calculation, and updates an adjustment parameter (of the equivalent circuit model) to an optimum based on the estimated state vector $X_n$. Then, the process returns to process of step S12 in FIG. 5.

As has been described above, according to the present embodiment, the current value and the voltage value are measured when the lead-acid battery 13 is in a charged state, and, based on the measured current value and voltage value and using an extended Kalman filter, the parameters are optimized by performing an adaptive learning on the equivalent circuit model. Then, a parameter corresponding to the reaction resistance Rr is obtained from among the optimized parameters, and, in a case where the reaction resistance Rr is greater than or equal to the threshold Th, it is determined to be in a fully charged state. Since a value of the reaction resistance Rr during charging shows a rapid change when it comes to a fully charged state, determination of whether it is in a fully charged state or not can be performed in a facilitated manner. Further, since such a rapid change does not depend on a type or an individual of the lead-acid battery 13, the fully charged state can be determined accurately regardless of the type or the individual.

Further, in the present invention, since the reaction resistance value Rr has been corrected based on the current value, the temperature and the degradation, the fully charged state can be determined accurately regardless of the magnitude of the current, whether the temperature is high or low and the progress of degradation.

Also, in the present embodiment, since adaptive learning is performed using an extended Kalman filter, the fully charged state can be determined accurately even in a noisy environment. In other words, in a case of the lead-acid battery 13 installed in a vehicle, the electric current always fluctuates due to operation of, for example, the load 17 such as a steering motor or a defogger, and such a fluctuation acts as a noise. However, by using an extended Kalman filter, the fully charged state can be determined accurately even under presence of such a noise.

(D) Variant Embodiments

It is to be noted that the aforementioned embodiment has been described by way of example and various other variant embodiments exist. For example, in each of the aforementioned embodiment, adaptive learning is carried out using an extended Kalman filter, but other method may be used. Specifically, adaptive learning may be carried out using a least square method, or adaptive learning may be carried out using a neural network model, a support vector machine or a genetic algorithm model.

For example, in the case of a least square method, the calculated value Vcal of the terminal voltage across both ends of the equivalent circuit model of FIG. 4 can be expressed by the following Equation 9.

[Equation 9]

$$Vcal = V0 + Rs \cdot I + Rr(I - I2) \quad (9)$$

Here, I2 can be expressed by the following Equation 10.

[Equation 10]

$$I2 = C \cdot \frac{dV2}{dt} \quad (10)$$

Then, the parameters can be optimized by performing adaptive learning on each parameter in such a manner that a sum of squares of deviation M in the following Equation 11 is minimized. As a specific example, each parameter in Equations 9 and 10 may be updated by a sequential operation method that updates the parameters to optimum values, such as a Gauss-Newton method or a Levenberg-Marquardt method, in which M is sequentially decreased from an initial value determined in advance.

[Equation 11]

$$M = \sum_{n=1}^{N} (Vmes_n - Vcal_n)^2 \quad (11)$$

It is to be noted that Vmes is an actual measured value of the voltage obtained from the voltage detecting unit 11.

Regarding the support vector machine or the neural network, an appropriate kernel function is defined for the case of the support vector machine and an appropriate network such as a multistage perceptron is defined for the case of the neural network. Then, using known data of a combination of correct solutions of the constants of the aforementioned equivalent circuit model for the inputs such as the current, the voltage and the temperature empirically determined in advance, a separating hyperplane is determined for the case of the support vector machine and a threshold/coupling coefficient of firing of neuron cells are determined to be optimal for the case of a neural network. Then, an optimum equivalent circuit model can be outputted for arbitrary data inputs regarding electric current, voltage and temperature.

Further, in the case of a genetic algorithm, for example, N individuals including all parameters are prepared and each parameter of each individual is generated randomly. Then, Vcal is calculated for each individual, and by taking an absolute value of a difference between the measured V and Vcal as a fitness, natural selection is carried out in accordance with the fitness, and a next generation individual is created by performing crossing-over, mutation and copying on each individual. For example, by repeating such operations, the parameters can be optimized.

Also, in the aforementioned embodiment, the reaction resistance Rr is corrected using the table shown in FIG. 7, but may also be corrected using a polynomial or the like that approximates relationships between the current, the temperature and the degradation, respectively, and the reaction resistance Rr.

Further, instead of correcting the reaction resistance Rr, the threshold Th may be corrected in accordance with the current, the temperature and the degradation. FIGS. 9A to 9C are diagrams illustrating the current, the temperature and the degradation, respectively, and the threshold Th before and after correction. In other words, FIG. 9A is a diagram illustrating the relationship between the threshold Th before correction, the measured current Imes and the threshold Th' after correction. In this example, the threshold Th' after correction decreases as the current value increases. FIG. 9B is a diagram illustrating the relationship between the threshold Th before correction, the measured temperature K and the threshold Th' after correction. In this example, a case where the temperature is 25° C. is taken as a reference, and the threshold Th' after correction is set to a smaller value in a case where the temperature is higher than 25° C. and the threshold Th' after correction is set to a larger value in a case where the temperature is lower than 25° C. Further, FIG. 9C is a diagram illustrating the relationship between the threshold Th before correction, the solution resistance Rs indicating the degradation, and the threshold Th' after correction. In this example, a case where Rs=0.5 mΩ corresponding to a new product condition is taken as a reference, and the threshold Th' after correction is set to a larger value as Rs becomes larger with the progress of the degradation.

Further, as shown in FIG. 5, in the aforementioned embodiment, determination of whether or not it is in a fully charged state is carried out only once, but the process shown in FIG. 5 may be carried out for a plurality of times and the final decision of whether it is in a fully charged state may be made in response to a frequency of occurrence that it is determined to be in a fully charged state. With such an embodiment, the determination of whether it is in a fully charged state can be made more accurately.

Further, in the aforementioned embodiment, the lead-acid battery was described by way of example, but the present invention may also be applied to other types of battery (e.g., a nickel-cadmium batter, etc). In such a case, the equivalent circuit model 30 may be modified depending on the type of battery.

Further, in the aforementioned embodiments, the control unit 10 may be a CPU, a ROM, a RAM, etc., but may also be a DSP (Digital Signal Processor) and the like.

What is claimed is:

1. A full charge sensing apparatus for sensing a fully charged state of a secondary battery based on an equivalent circuit model of the secondary battery, the apparatus comprising:
 a measuring unit that measures a voltage and a current during charging of the secondary battery;
 a learning unit that performs a learning process on a plurality of parameters in the equivalent circuit model using a result of measurement of the measuring unit; and
 a determining unit that determines that the secondary battery is in a fully charged state in a case where, among the parameters on which the learning process has been performed by the learning unit, a parameter corresponding to a reaction resistance of the secondary battery is greater than a predetermined threshold.

2. The full charge sensing apparatus according to claim 1, wherein one of the learning unit and the determining unit corrects one of a value of the reaction resistance and the threshold based on a value of the current.

3. The full charge sensing apparatus according to claim 1, wherein one of the learning unit and the determining unit corrects one of a value of the reaction resistance and the threshold based on a temperature of the secondary battery.

4. The full charge sensing apparatus according to claim 1, wherein one of the learning unit and the determining unit corrects one of a value of the reaction resistance and the threshold based on a state of degradation of the secondary battery.

5. The full charge sensing apparatus according to claim 1, wherein the learning unit optimizes the plurality of parameters by a Kalman filter operation in such a manner that errors between values of the voltage and the current measured by the measuring unit and a response of the equivalent circuit model are minimized.

6. The full charge sensing apparatus according to claim 1, wherein the learning unit optimizes the plurality of parameters by a least square operation in such a manner that errors between values of the voltage and the current measured by the measuring unit and a response of the equivalent circuit model are minimized.

7. The full charge sensing apparatus according to claim 1, wherein the learning unit optimizes the plurality of parameters by a neural network in such a manner that errors between values of the voltage and the current measured by the measuring unit and a response of the equivalent circuit model are minimized.

8. The full charge sensing apparatus according to claim 1, wherein the learning unit optimizes the plurality of parameters by a support vector machine in such a manner that errors between values of the voltage and the current measured by the measuring unit and a response of the equivalent circuit model are minimized.

9. A secondary battery power source system having the full charge sensing apparatus according to claim 1.

10. A full charge sensing method of sensing a fully charged state of a secondary battery based on an equivalent circuit model of the secondary battery, the method comprising:
 measuring a voltage and a current during charging of the secondary battery;
 performing a learning process on a plurality of parameter in the equivalent circuit model using a result of said measuring of a voltage and a current during charging of the secondary battery; and
 performing a determination in which the secondary battery is determined to be in a fully charged state in a case where a parameter corresponding to a reaction resistance of the secondary battery is greater than a predetermined threshold, the parameter corresponding to the reaction resistance of the secondary battery being one of the parameters on which the learning process has been performed.

11. The method according to claim 10 wherein said learning process is performed by a processor in cooperation with a memory.

12. The method according to claim 10 wherein said determination is performed by a processor in cooperation with a memory.

13. The method according to claim 10 wherein said learning process and said determination are performed by a processor in cooperation with a memory.

* * * * *